United States Patent
Nishikawa et al.

(10) Patent No.: US 7,586,257 B2
(45) Date of Patent: Sep. 8, 2009

(54) ORGANIC EL PANEL WITH ORGANIC LAYER FOR EMITTING LIGHT OF A SPECIFIC COLOR AND ORGANIC LAYER FOR EMITTING WHITE LIGHT

(75) Inventors: Ryuji Nishikawa, Gifu (JP); Tetsuji Omura, Ogaki (JP)

(73) Assignee: Sanyo Electric Co., Ltd. (JP)

( * ) Notice: Subject to any disclaimer, the term of this patent is extended or adjusted under 35 U.S.C. 154(b) by 593 days.

(21) Appl. No.: 10/952,962

(22) Filed: Sep. 29, 2004

(65) Prior Publication Data

US 2005/0088085 A1    Apr. 28, 2005

(30) Foreign Application Priority Data

Sep. 30, 2003   (JP)   ............................. 2003-342485
Sep. 22, 2004   (JP)   ............................. 2004-275672

(51) Int. Cl.
*H01J 63/04*   (2006.01)
*H01J 1/62*    (2006.01)

(52) U.S. Cl. .................. 313/506; 313/483; 313/498; 313/500; 313/504; 313/505; 428/690; 428/917

(58) Field of Classification Search .................. None
See application file for complete search history.

(56) References Cited

U.S. PATENT DOCUMENTS

| 7,030,553 B2* | 4/2006 | Winters et al. .............. 313/504 |
| 2001/0043043 A1 | 11/2001 | Aoyama et al. ............. 313/506 |
| 2003/0006699 A1* | 1/2003 | Ogino et al. ................ 313/506 |
| 2003/0146696 A1* | 8/2003 | Park et al. ................... 313/506 |
| 2003/0173897 A1* | 9/2003 | Iwase et al. ................. 313/512 |
| 2004/0217694 A1* | 11/2004 | Cok et al. ................... 313/504 |
| 2005/0073230 A1* | 4/2005 | Nishikawa et al. .......... 313/111 |

FOREIGN PATENT DOCUMENTS

| JP | 2003-115382 | 4/2003 |
| JP | 2003-187975 | 7/2003 |
| WO | 02-15292 A2 | 2/2002 |

OTHER PUBLICATIONS

Office Action for corresponding Korean Patent Application No. 10-2004-77811 , mailed Apr. 27, 2006, with its excerpt English translation.
Korean Patent Laid-Open Publication No. 2001-83094, filed Aug. 1, 2001, with its English abstract.
First Office Action for the corresponding Chinese Patent Application No. 2004/10080675.8 and its excerpt English translation mailed Oct. 19, 2007.

* cited by examiner

*Primary Examiner*—Nimeshkumar D. Patel
*Assistant Examiner*—Natalie K Walford
(74) *Attorney, Agent, or Firm*—Cantor Colburn LLP (57) ABSTRACT

A green pixel is provided with an organic EL element having an emissive layer which emits green light, but is not provided with a color filter. On the other hand, red and blue pixels comprise organic EL elements having an emissive layer which emits white light. The white emissive layer is composed of a lamination of an orange organic emissive layer and a blue organic emissive layer. The red and blue pixels are further provided with red and blue color filters, respectively, to limit the emitted white light to those colors.

13 Claims, 9 Drawing Sheets

ORGANIC EL PANEL WITH ORGANIC LAYER FOR EMITTING LIGHT OF A SPECIFIC COLOR AND ORGANIC LAYER FOR EMITTING WHITE LIGHT

CROSS-REFERENCE TO RELATED APPLICATIONS

The priority Japanese applications No. 2003-342485 and No. 2004-275672 upon which this patent application is based is hereby incorporated by reference.

BACKGROUND OF THE INVENTION

1. Field of the Invention

The present invention relates to an organic EL panel formed by arranging a plurality of organic EL elements each comprising an organic layer provided between first and second electrodes and emitting light when a voltage is applied between the first and second electrodes.

2. Description of the Related Art

In recent years, organic electroluminescence (hereinafter referred to as "EL") displays have gained attention as one type of flat display which would replace liquid crystal displays in the coming generation. In a display panel of an organic EL display (hereinafter referred to as "organic EL panel"), the color of light emitted from each pixel may be determined depending on the emissive material used in the organic emissive layer of each pixel. By allowing the pixels to emit light of different colors using different emissive materials, RGB indication can be achieved.

However, when employing this method, it is difficult to ensure uniform light emission for all colors because the emissive materials for different colors have different emissive efficiency.

In order to achieve full color indication, another method for determining pixel colors is proposed in Japanese Patent Laid-Open Publication No. 2003-115382. In this method, light of a single color alone is initially emitted, and color filters are employed to obtain light of other colors. However, according to this method, it is difficult to achieve sufficient emissive efficiency for the respective colors.

As such, when using conventional organic EL elements, there exist difficulties in obtaining uniform emissive efficiency for the respective colors and achieving appropriate white balance.

SUMMARY OF THE INVENTION

The present invention provides an organic EL panel in which an appropriate balance among different colors can be attained easily.

According to the present invention, in order to obtain a specific color, an organic material which emits light of that color is employed. For other colors, white light is emitted, and color filters are applied to the white light to obtain those colors. With this arrangement, emissive efficiency for the respective colors can be made relatively uniform.

For example, a white emissive layer may be composed of a lamination of an orange emissive layer and a blue emissive layer. In this case, the emitted white light has a relatively low intensity in green color. As a result, when color filters are applied to the emitted white light to obtain the three colors of RGB, green light becomes weaker than the other colors. According to the present invention, such a problem can be avoided by employing in a green pixel an organic EL element including an organic material which emits green light, so as to obtain light having sufficient intensity from the green pixel.

DESCRIPTION OF THE PREFERRED EMBODIMENTS

Preferred embodiments of the present invention will next be described referring to the drawings.

Figure 1:
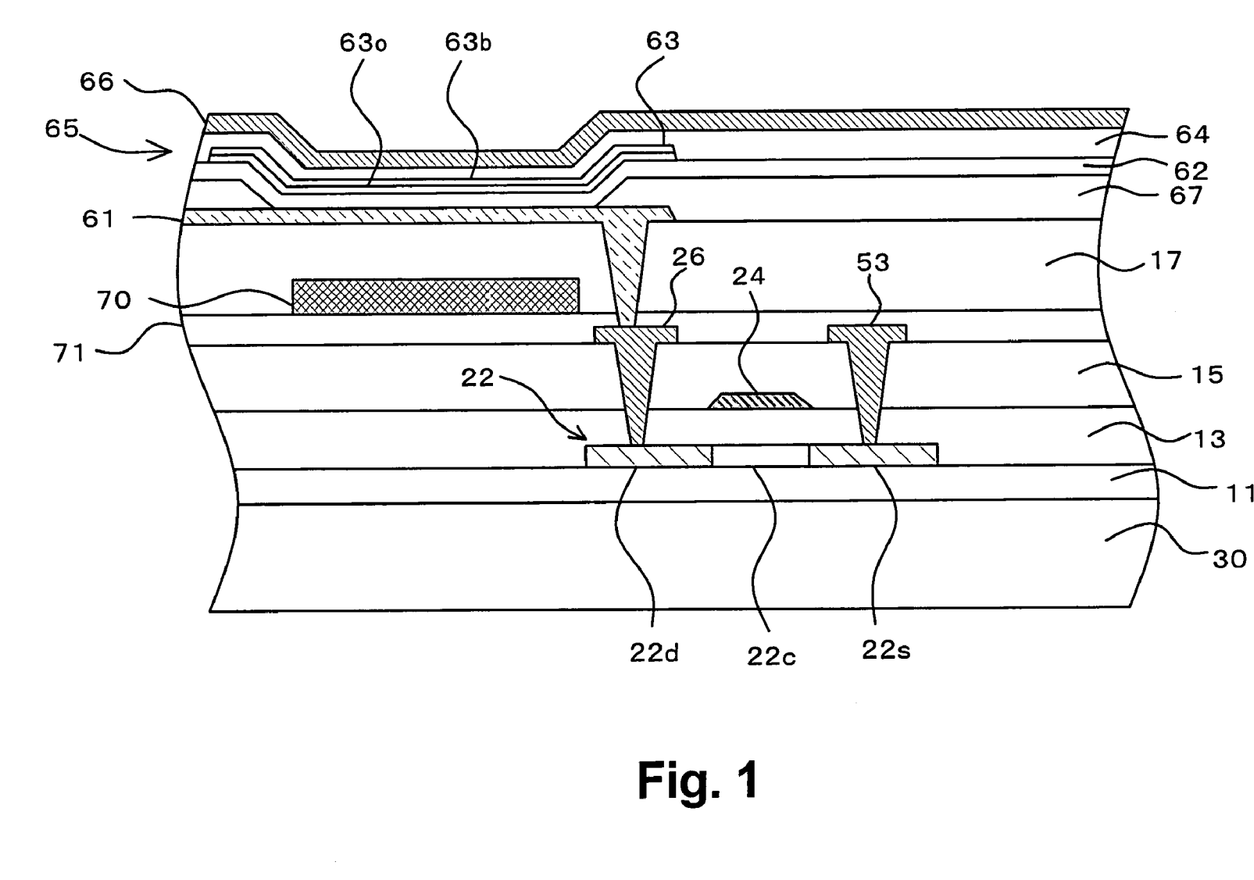
FIG. 1 is a cross-sectional view showing a configuration of a pixel portion of an organic EL panel.

FIG. 1 is a cross-sectional view showing a configuration of a light-emitting region and a drive TFT (thin film transistor) within one pixel. It should be noted that each pixel actually includes a plurality of TFTs. The drive TFT is the TFT which controls a current supplied from a power line to an organic EL element within the pixel. On a glass substrate 30, a buffer layer 11 composed of a lamination of an SiN layer and an SiO$_2$ layer is formed over the entire surface. Further on top, an active layer 22 made of polysilicon is disposed in predetermined areas (where TFTs are to be created).

Covering the active layer 22 and the buffer layer 11, a gate insulation film 13 is formed over the entire surface. The gate insulation film 13 may be formed by laminating an SiO$_2$ layer and an SiN layer. On top of the gate insulation film 13 at a position above a channel region 22c, a gate electrode 24 composed of chromium or the like is arranged. Subsequently, impurities are doped into the active layer 22 while using the gate electrode 24 as a mask. As a result of this process, in the active layer 22, the channel region 22c without impurities is provided in the central portion under the gate electrode 24, while a source region 22s and a drain region 22d doped with impurities are formed on both sides of the channel region 22c.

Next, covering the gate insulation film 13 and the gate electrode 24, an interlayer insulation film 15 is formed over the entire surface. Contact holes are then created in the interlayer insulation film 15 at positions corresponding to the source region 22s and the drain region 22d located under the interlayer insulation film 15. Subsequently, a source electrode 53 and a drain electrode 26 are provided through these contact holes and on the upper surface of the interlayer insulation film 15, so as to connect with the source region 22s and the drain region 22d, respectively. It should be noted that the source electrode 53 is connected to a power line (not shown). While the drive TFT formed as described above is a p-channel TFT in this example, the drive TFT may alternatively be constituted as an n-channel TFT.

Covering the interlayer insulation film 15, source electrode 53, and drain electrode 26, a planarization film 17 is provided over the entire surface. On top of the planarization film 17, a transparent electrode 61 which serves as an anode is formed. Further, at a position above the drain electrode 26, a contact hole is created through the planarization film 17. The drain electrode 26 and the transparent electrode 61 are connected via this contact hole.

While an organic film such as acrylic resin is typically used to form the interlayer insulation film 15 and planarization film 17, it is also possible to employ TEOS or an inorganic film. A metal such as aluminum may be favorably used to create the source electrode 53 and drain electrode 26. For the transparent electrode 61, ITO is typically employed.

The transparent electrode 61 normally has a substantially rectangular overall shape with a contacting portion protruding laterally and downward through the contact hole for connection with the drain electrode 26.

An organic layer 65 and a counter electrode 66 are arranged on top of the transparent electrode 61. The organic layer 65 comprises a hole transport layer 62 formed over the entire surface, an organic emissive layer 63 formed slightly larger than the light-emitting region, and an electron transport layer 64 formed over the entire surface. The counter electrode 66, which serves as a cathode, is made of metal such as aluminum, and is formed over the entire surface.

A planarization film 67 is provided at a position on the upper surface of the peripheral portion of the transparent electrode 61 and underneath the hole transport layer 62. The planarization film 67 limits the portion at which the hole transport layer 62 directly contacts the transparent electrode 61, thereby defining the light-emitting region in each pixel. It should be noted that, while an organic film such as acrylic resin is typically used for the planarization film 67, it is also possible to employ TEOS or an inorganic film.

The hole transport layer 62, the organic emissive layer 63, and the electron transport layer 64 are composed of materials that are conventionally used in an organic EL element. The color of emitted light is determined depending on the material (usually the dopant) of the organic emissive layer 63. For example, the hole transport layer 62 maybe composed of NPB, the organic emissive layer 63 for emitting green light may be composed of $Alq_3$+CFDMQA, and the electron transport layer 64 may be composed of $Alq_3$. When using a white organic emissive layer 63, the organic emissive layer 63 may include a blue organic emissive layer 63 composed of TBADN+NPB and an orange organic emissive layer 63*o* composed of NPB+DBzR.

According to the present embodiment, a green emissive layer or a white emissive layer is employed as the organic emissive layer 63 in each pixel. FIG. 1 illustrates a case in which a white emissive layer is employed. As detailed below, a white emissive layer is formed as a laminated structure composed of an orange emissive layer and a blue emissive layer.

In the above-described arrangement, when the drive TFT is turned on by a voltage set in the gate electrode 24, current from the power line flows from the transparent electrode 61 to the counter electrode 66. This current causes light emission in the organic emissive layer 63. The emitted light passes through the transparent electrode 61, planarization film 17, interlayer insulation film 15, gate insulation film 13, and glass substrate 30, to be ejected downward in FIG. 1.

According to the present embodiment, a color filter 70 is further provided in a layer between the interlayer insulation film 15 and the planarization film 17. The color filter 70 may be composed of a material such as a photosensitive resin or polymer having a pigment mixed therein, similarly to color filters used in a liquid crystal display and a CCD camera.

The position of the color filter 70 is not limited to the top of the interlayer insulation film 15 (with an SiN film 71 disposed between the color filter 70 and the interlayer insulation film 15). Alternatively, the color filter 70 maybe formed on the upper surface or the underside of the glass substrate 30. A light-shielding film is often provided on the upper surface of the glass substrate 30 in order to prevent external light from irradiating on the drive TFT. In such a case, the color filter 70 may be formed in the same layer as the light-shielding film to simplify the manufacturing process.

Figure 2:
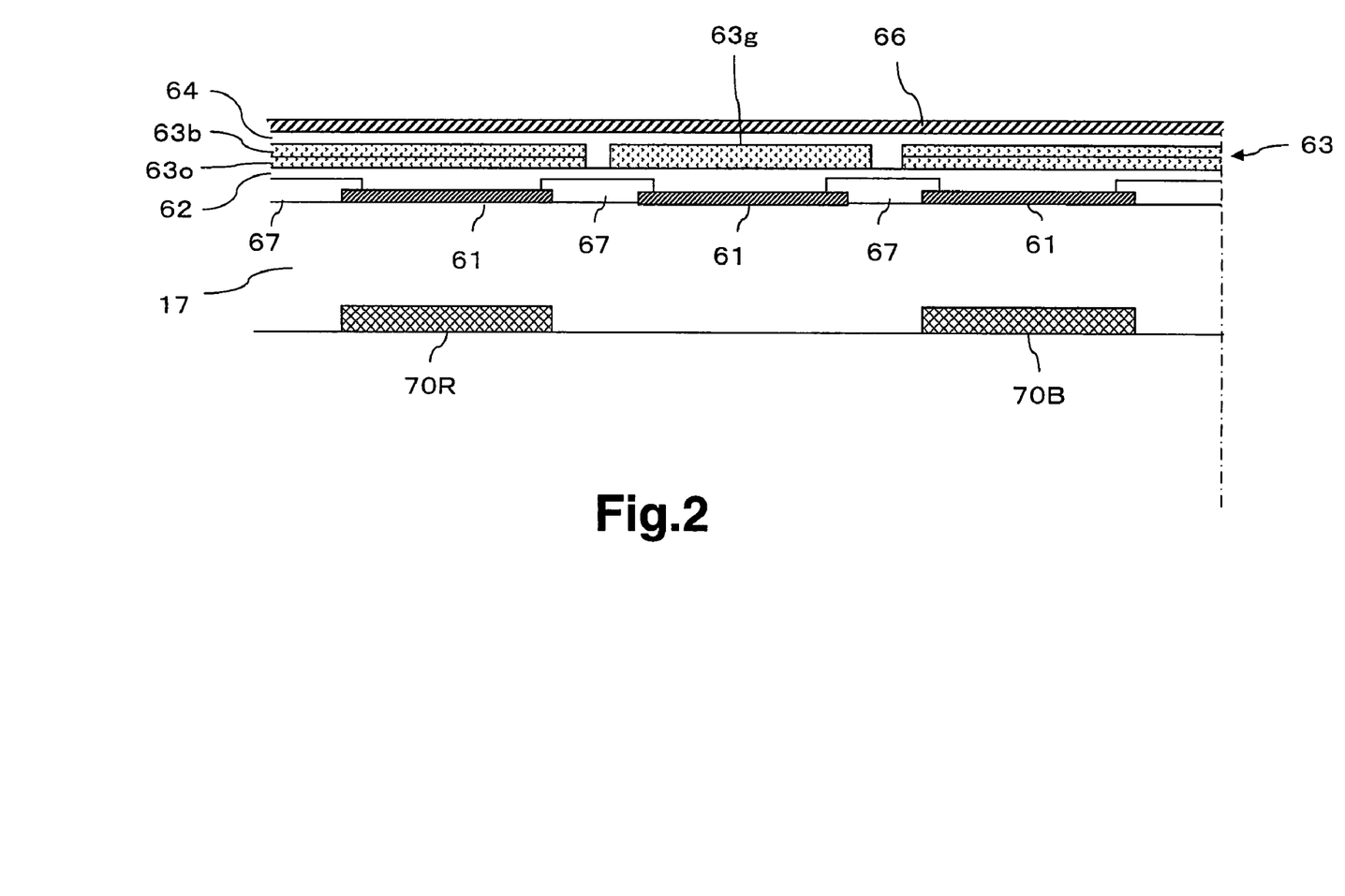
FIG. 2 shows an example configuration of organic EL elements for the respective colors of R, G, and B.

FIG. 2 schematically shows three pixels of R, G, and B (the three RGB pixels may be collectively referred to as one pixel while calling the individual ROB pixels "subpixels"). In the red R and blue B pixels, the organic emissive layer 63 is constituted with a two-layer structure including a blue emissive layer 63*b* and an orange emissive layer 63*o*. According to this arrangement, holes and electrons combine in regions near the border between the two emissive layers 63*b* and 63*o*, thereby generating both blue light and orange light. The light of the two colors in combination are emitted as white light. On the other hand, in the green G pixel, the organic emissive layer 63*g* is a single layer composed of an emissive material which emits green light.

Furthermore, the emitted light in red pixel passes through a color filter 70R is change to red light and the emitted light in a blue pixel passes through a color filter 70B is changed to blue light.

The hole transport layer 62 and the electron transport layer 64 are formed on the entire surface extending over all of the pixels. While the green organic emissive layer 63 is provided in the organic EL element portions of green pixels only, the white organic emissive layer 63 need not be separately formed for the respective pixels and may be disposed extending in EL element portions in pixels other than the green pixels.

Figure 3:
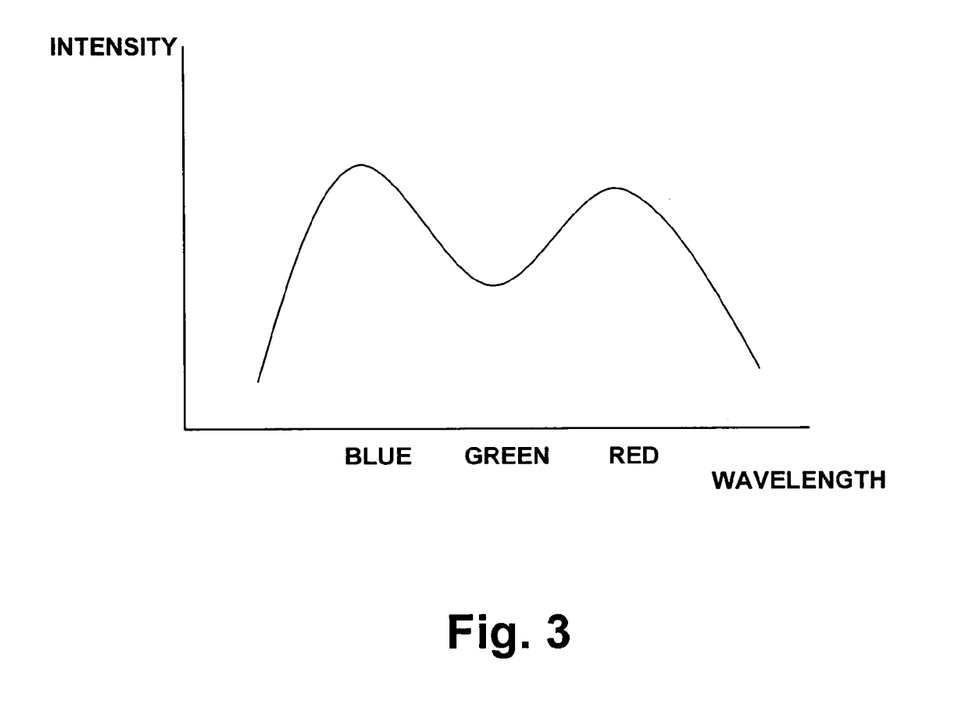
FIG. 3 is a diagram showing an example spectrum of a white-emitting organic EL element.

In the present embodiment as described above, with respect to one color, light emitted from the emissive material is ejected without change of color. As explained above, when white color is produced by emission of two colors, one color among the three primary colors tends to have lower intensity compared to the other two colors. For example, when light emission is executed by two emissive layers of blue and orange, the intensity of green light becomes lower than the other colors, as shown in FIG. 3. In order to achieve uniform intensity, an emissive layer which emits green light is employed in a green pixel, such that green color can be obtained at a sufficient intensity level. In this manner, effective color display can be accomplished. An example of a green emissive material constituting the green emissive layer is $Alq_3$.

Furthermore, a microresonator may be provided for a pixel of a specific color or for all pixels in order to select and intensify light of the corresponding color.

Figure 4:
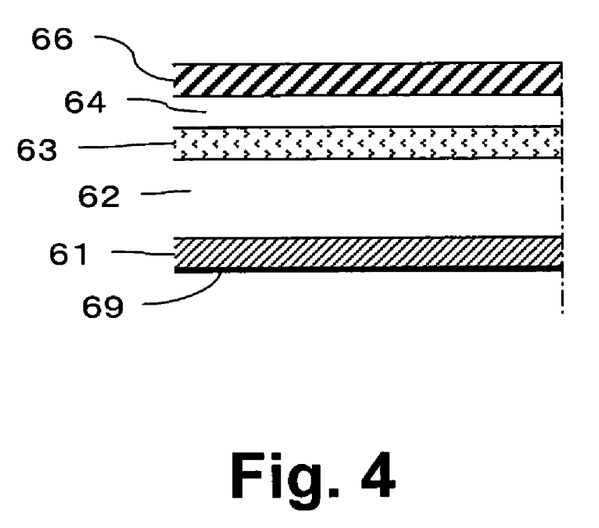
FIG. 4 shows a pixel structure in which a microresonator is provided.

FIG. 4 shows a configuration in which an optical microresonator is provided in a pixel which emits a specific color. As can be seen, a semi-transmissive film 69 composed of a thin film of silver (Ag) or the like is provided on the underside of the transparent electrode 61 at the position of the light-emitting region. Accordingly, light generated in the organic emissive layer 63 is reflected by the semi-transmissive film 69. Because the counter electrode 66 functions as a reflective layer, the light is repetitively reflected between the semi-transmissive film 69 and the counter electrode 66.

The interval structure between the semi-transmissive film 69 and the counter electrode 66 is configured such that this interval optically functions as a microresonator for a specific color. In other words, the optical length of the interval is set to a value obtained by multiplying the wavelength of a desired color by an integer or a reciprocal of an integer (such as 1/2, 1, and 2). For example, the values of refractive index for the materials constituting each layer in the interval may be approximately as follows: 1.9 for ITO constituting the transparent electrode 61; 1.46 for $SiO_2$ constituting the gate insulation film 13; 2.0 for SiN also used for the gate insulation film 13; and 1.7 for the organic layer 65 including the organic emissive layer 63. By multiplying the physical thickness of each layer between the semi-transmissive film 69 and the counter electrode 66 by a corresponding refractive index, and then summing the calculated values, the optical thickness of the interval can be obtained. In the present embodiment, this optical thickness is set to a value relative to the wavelength of light to be extracted. With this arrangement, the interval between the semi-transmissive film 69 and the counter electrode 66 functions as a microresonator, and enables efficient extraction of light having a desired wavelength. More specifically, light emitted from the organic emissive layer 63 is repetitively reflected between the semi-transmissive film 69 and the counter electrode 66, and as a result, light components having a specific wavelength are selectively passed through the semi-transmissive film 69. By further repeating such reflection within the microresonator, the probability that light having the specific frequency will be ejected can be increased, resulting in enhanced efficiency.

It should be noted that it is preferable to provide a color filter 70 even when a microresonator is provided. When a microresonator limits light passing through the semi-transmissive film 69 as described above, it may be considered that the color filter 70 is not a fundamental requirement. However, a microresonator basically regulates only the wavelength of light that is incident from a direction perpendicular to the surface of the semi-transmissive film 69. Accordingly, the wavelength of light ejected from the microresonator is highly dependent on the viewing direction, such that different colors are likely to be detected when the panel is viewed at an angle. By providing the color filter 70 as in the present embodiment to pass the ejected light through the color filter 70, the obtained light would unfailingly have a specific wavelength. In this manner, the viewing angle dependency of the panel can be substantially eliminated.

Figure 5:
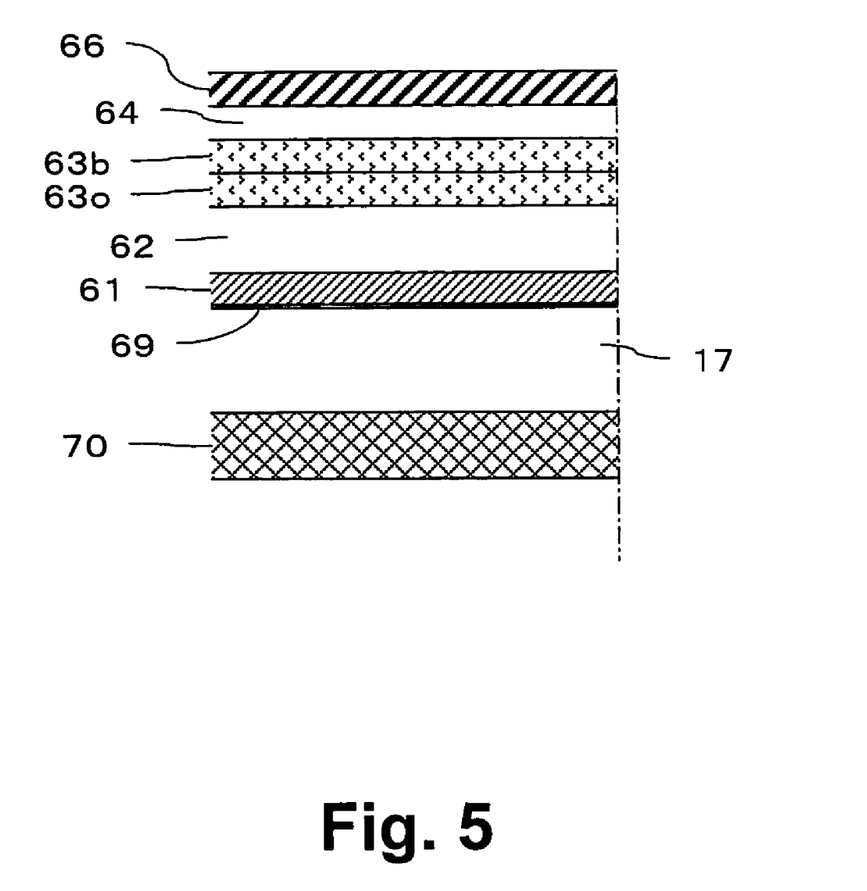
FIG. 5 shows a pixel structure of a white-emitting EL element in which a microresonator is provided.

A microresonator may also be provided for a pixel in which white light is emitted, as shown in FIG. 5. As can be seen, the emissive layer 63 is constituted with a two-layer structure including a blue emissive layer 63b and an orange emissive layer 63o. Using a microresonator, a specific color among the emitted white light is intensified and selected, and further selected by a color filter 70 to be ejected.

Figure 6:
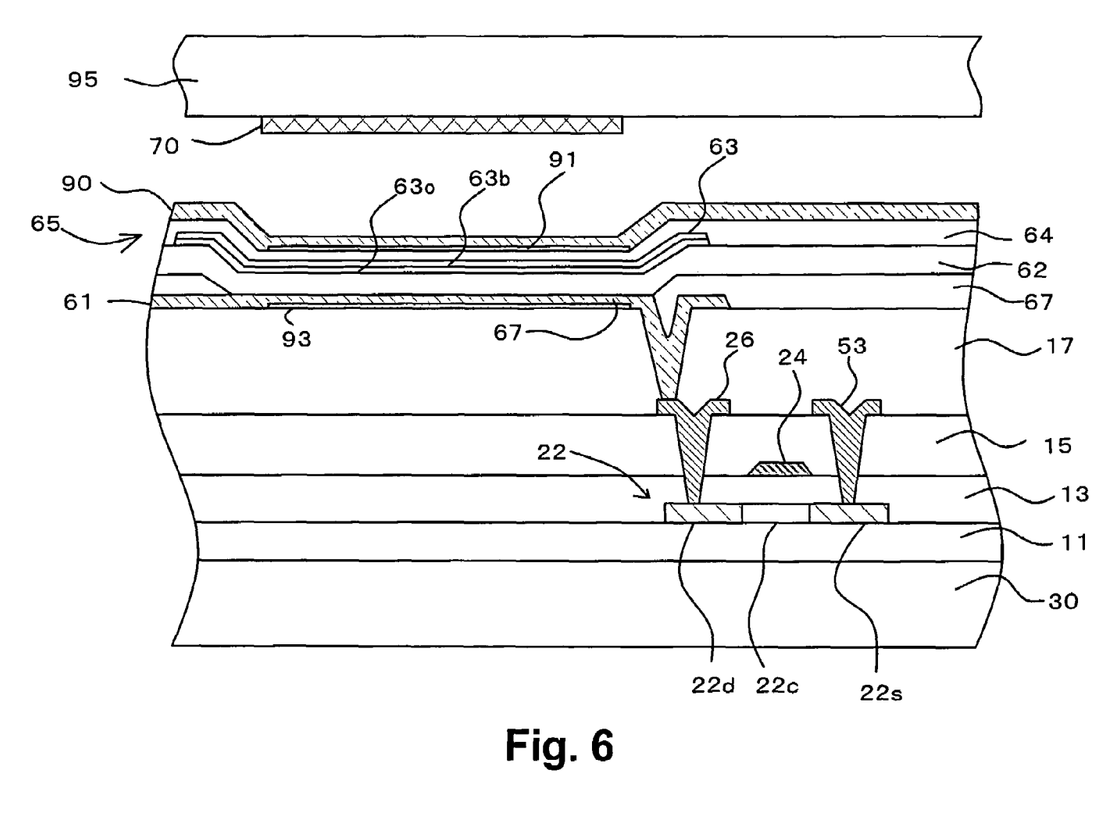
FIG. 6 shows an example configuration of a top-emission structure.

While the above-described embodiments refer to a bottom emission type panel in which light is ejected via the glass substrate 30, an EL panel according to the present invention may alternatively be configured as top emission type in which light is ejected via the cathode. FIG. 6 shows a configuration of a pixel portion of a top emission type panel provided with a microresonator. In this example, a transparent cathode 90 composed of ITO is employed as the cathode. Further, a semi-transmissive film 91 is disposed on the underside of the transparent cathode 90.

Furthermore, a metal reflective layer 93 is formed under the transparent electrode 61. The interval structure between the surface of the metal reflective layer 93 and the semi-transmissive film 91 functions as the microresonator.

In this embodiment, the color filter 70 is provided on the underside of a sealing substrate 95. It should be noted that the sealing substrate 95 connects to the substrate 30 at its peripheral portion alone, and serves to seal the upper space of the substrate 30 having components such as the organic EL element formed thereon. When the microresonator needs to be eliminated from the pixel configuration of FIG. 6, this can be achieved by simply omitting the semi-transmissive film 91. When the organic emissive layer 63 is a single layer which emits a specific color, the color filter 70 may be unnecessary.

While the TFTs in the above embodiments are described as top gate type TFTs, bottom gate type TFTs may alternatively be used.

FIGS. 7-11 diagrammatically illustrate example pixel configurations of an organic EL panel according to the present invention. To simplify explanation, only the characteristic structures are schematically shown in these drawings. The electrodes are not shown, and the electron transport layer and hole transport layer are omitted where appropriate.

Figure 7:
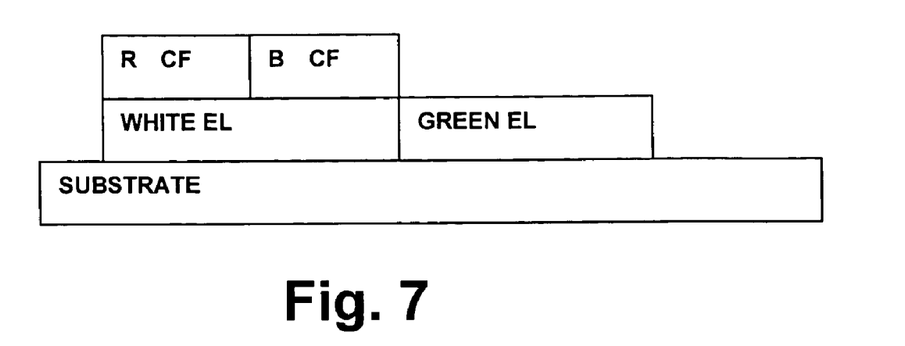
FIGS. 7-13 are schematic diagrams showing example pixel configurations of an organic EL panel according to the present invention.

The pixel structure of FIG. 7 includes two types of organic emissive layers, namely, a white organic emissive layer (white EL) and a green organic emissive layer (green EL). With respect to the white EL, a red color filter (R CF) and a blue color filter (B CF) are arranged. In this manner, pixels of three colors of RGB are provided.

Figure 8:
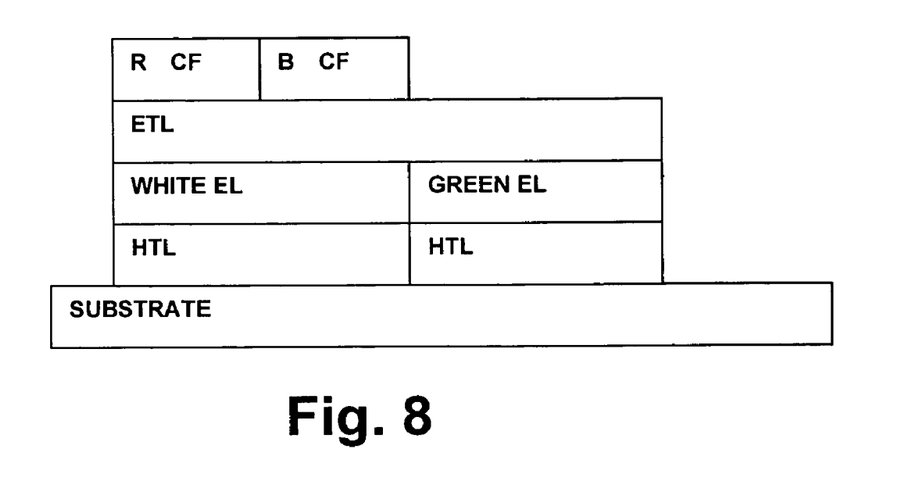

FIG. 8 shows a configuration identical to FIG. 7 except in that the electron transport layer (ETL) is provided as a layer common to the three pixels while the hole transport layer (HTL) is formed independently for each pixel.

Figure 9:
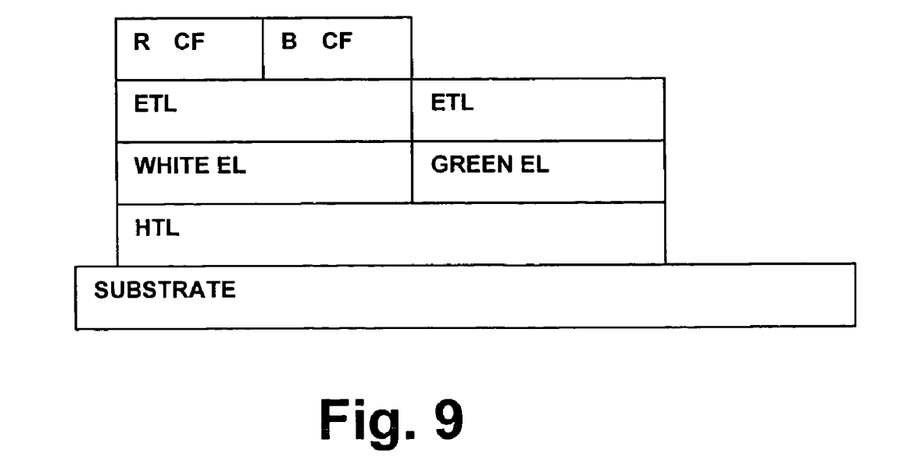

In contrast to FIG. 8, FIG. 9 shows the hole transport layer (HTL) as a layer provided commonly to the three pixels while illustrating the electron transport layer (ETL) as being formed independently for each pixel.

Figure 10:
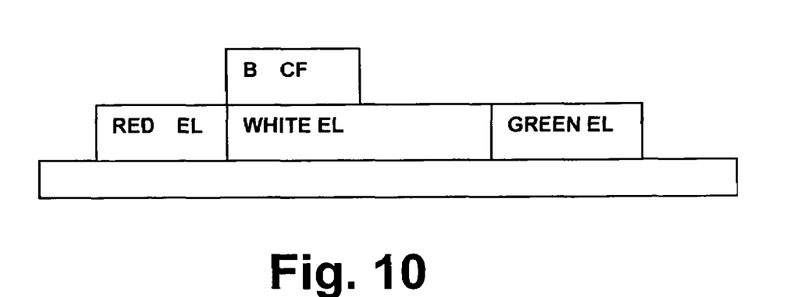

In FIG. 10, a blue color filter (B CF) is arranged with respect to a portion of the white EL, such that blue and white light can be obtained from the white EL. Further, a red organic emissive layer (red EL) and a green organic emissive layer (green EL) are disposed without corresponding color filters, such that light from those ELs is ejected in the emitted form. A panel which emits four colors of R, G, B, and W (red, green, blue, and white) can be provided in this manner.

Figure 11:
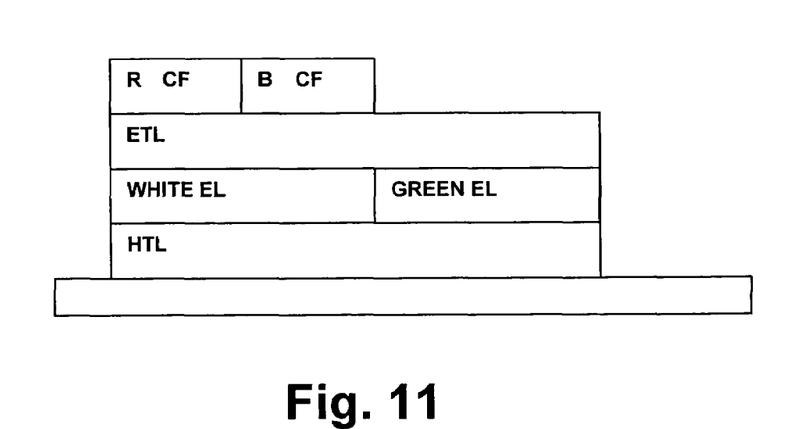

FIG. 11 shows a configuration identical to FIG. 7 except in that the hole transport layer (HTL) and the electron transport layer (ETL) are both formed commonly for a plurality of pixels (such as all pixels).

Figure 12:
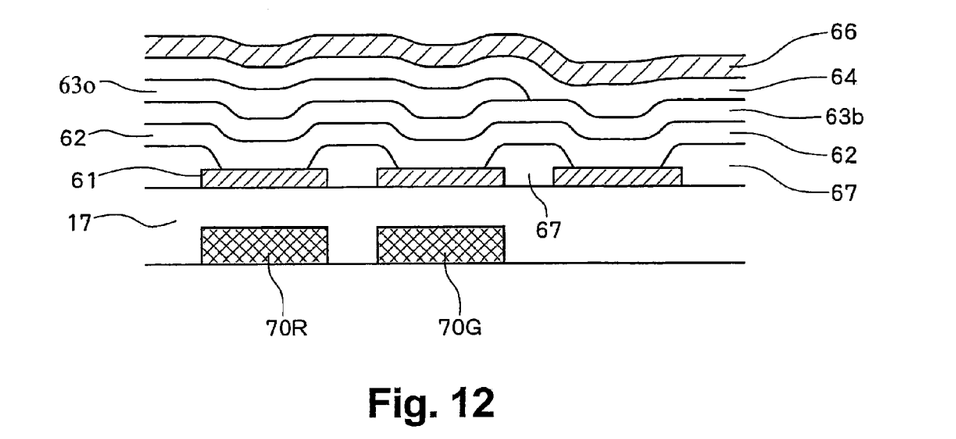

FIG. 12 schematically shows a further example configuration. It should be noted that, in FIG. 12, the TFT structure and the structure connecting the TFT and the transparent electrode 61 are not shown.

A red color filter 70R is arranged below the transparent electrode 61 in a red pixel, while a green color filter 70G is arranged below the transparent electrode 61 in a green pixel. In these red and green pixels, the blue organic emissive layer 63b and the orange organic emissive layer 63o are provided in lamination. A blue pixel includes the blue organic emissive layer 63b, but does not include a color filter.

The hole transport layer 62, blue organic emissive layer 63b, electron transport layer 64, and counter electrode 66 are formed extensively over the entire surface so as to serve commonly for all pixels. The orange organic emissive layer 63o is provided commonly in all pixels other than blue pixels.

According to this arrangement, the blue organic emissive layer 63b can be simply formed over the entire surface, thereby allowing to simplify the manufacturing process.

Furthermore, the color filter in the above embodiment can be replaced with a color conversion layer. One example of color conversion layer that may be used for this purpose is described in Japanese Patent Laid-Open Publication No. 2003-187975. Using this color conversion layer, a specific color can be converted into another specific color. Accordingly, instead of white light, light generated in a specific color can be used to obtain light of other colors. For example, light emitted by a blue emissive layer may be converted into red and green light. In this case, a single blue emissive layer alone is formed as the organic emissive layer over the entire surface. Further, red and green pixels are provided with color conversion layers for converting the emitted blue light into red and green light, respectively. Each of the RGB pixels can be realized in this manner.

Figure 13:
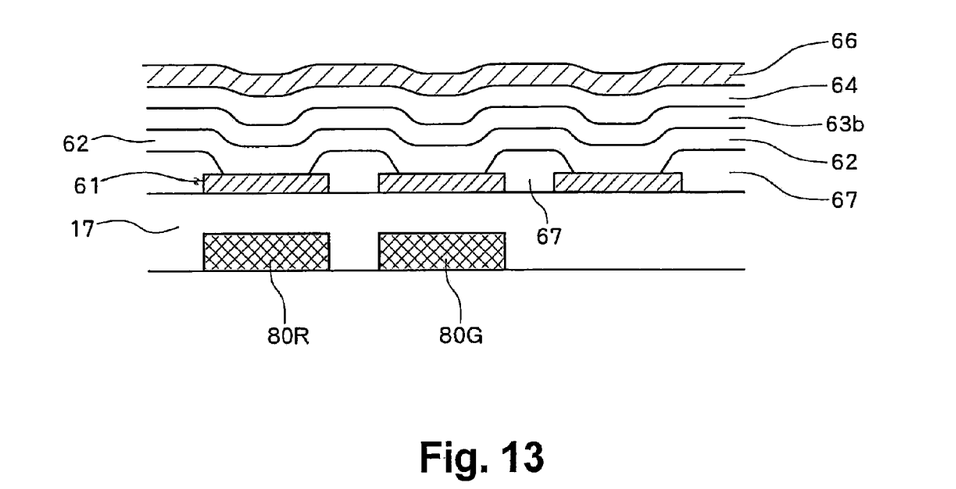

FIG. 13 illustrates the above-described pixel configuration using color conversion layers. As can be seen, the blue organic emissive layer 63b alone is provided as the organic emissive layer, and this layer is formed extensively over the entire surface (that is, commonly for all pixels). Further, a color conversion layer 80R for converting blue light into red light is provided in the red pixel, while a color conversion layer 80G for converting blue light into green light is provided in the green pixel. In the blue pixel, the emitted blue light is allowed to be ejected as is, without providing any color conversion layer. According to this arrangement, all of the hole transport layer 62, organic emissive layer 63 (63b), and electron transport layer 64 can be formed extensively over the entire substrate (commonly for all pixels), thereby simplifying the manufacturing process.

What is claimed is:

1. An organic EL panel formed by arranging a plurality of pixels each including an organic EL element, wherein
   each of the organic EL elements includes an organic layer provided between first and second electrodes, and emits light when a voltage is applied between the first and second electrodes to allow a current to flow in the organic layer;
   among the plurality of organic EL elements, an organic EL element for a first specific color other than white includes an organic layer for emitting light of the first specific color and ejects this light of the first specific color externally to the organic EL panel without color modification;
   an organic EL element for at least a second specific color includes an organic layer for emitting white light, which is limited to the at least a second specific color by a color filter, and ejects light of the at least a second specific color externally to the organic EL panel;
   wherein the color filter includes color filters for two colors; and
   wherein the organic layer for emitting white light is composed of a lamination of emissive layers which emit light of two different colors; and
   the organic layer for emitting light of the first specific color is formed by extending one and only one of the emissive layers.

2. An organic EL panel as claimed in claim 1, wherein
   each of the organic EL elements includes at least a hole transport layer and an organic emissive layer as the organic layer; and
   the hole transport layer is formed as a layer common with respect to the emissive layers for a plurality of colors.

3. An organic EL panel as claimed in claim 1, wherein
   each of the organic EL elements includes at least an electron transport layer and an organic emissive layer as the organic layer; and
   the electron transport layer is formed as a layer common with respect to the emissive layers for a plurality of colors.

4. An organic EL panel as claimed in claim 1, wherein
   each of the organic EL elements includes at least a hole transport layer, an electron transport layer, and an organic emissive layer as the organic layer; and
   the hole transport layer and the electron transport layer are formed as layers common with respect to the emissive layers for a plurality of colors.

5. An organic EL panel as claimed in claim 1, wherein
   in at least a number of the plurality of pixels, light emitted from the organic layer for emitting white light is ejected as white light in the emitted form.

6. An organic EL panel as claimed in claim 1, wherein
   a thin film transistor for driving an organic EL element is provided corresponding to each of the plurality of organic EL elements;
   the plurality of organic EL elements are formed in a layer located above the corresponding thin film transistors, with a planarization film disposed between the organic EL elements and the thin film transistors.

7. An organic EL panel as claimed in claim 1, wherein
   the plurality of organic EL elements are formed on a pixel substrate;
   a counter substrate is arranged opposing the pixel substrate; and
   the color filter is formed on the counter substrate.

8. An organic EL panel as claimed in claim 1, wherein
   a microresonator for intensifying light of the specific color is provided with respect to the organic EL element which emits light of the specific color.

9. An organic EL panel as claimed in claim 1, wherein
   a microresonator for intensifying light having color of the color filter is provided with respect to the organic EL element which ejects light of the other color.

10. An organic EL panel as claimed in claim 1, wherein
    the organic layer for emitting light of the specific color is formed commonly for all of the pixels.

11. An organic EL panel as claimed in claim 1, wherein
    the organic layer for emitting white light is composed of a lamination of two layers including a blue emissive layer and an orange emissive layer; and
    the organic layer for emitting light of the specific color is composed of the blue emissive layer.

12. An organic EL panel formed by arranging a plurality of pixels each including an organic EL element, wherein
    each of the organic EL elements includes an organic layer provided between first and second electrodes, and emits light when a voltage is applied between the first and second electrodes to allow a current to flow in the organic layer;
    among the plurality of organic EL elements, an organic EL element for a first specific color includes an organic layer for emitting light of the first specific color and ejects this light of the first specific color externally to the organic EL panel without color modification;
    an organic EL element for at least a second specific color includes an organic layer for emitting white light, which is limited to the at least a second specific color by a color filter, and ejects light of the at least a second specific color externally to the organic EL panel;
    wherein the color filter includes color filters for two colors;
    wherein the organic layer for emitting light of the first specific color is formed independently of the organic layer for emitting white light; and
    wherein the first specific color is a color other than white and the two colors of the color filter.

13. An organic EL panel as claimed in claim 12, wherein the first specific color is green and the white light is formed of orange light and blue light.

* * * * *